US012596138B2

(12) United States Patent
Nault et al.

(10) Patent No.: US 12,596,138 B2
(45) Date of Patent: Apr. 7, 2026

(54) ELECTRICAL SENSOR AND METHOD OF MOLDING AN INSULATOR AROUND AN ELECTRICAL SENSOR

(71) Applicant: G&W Electric Company, Bolingbrook, IL (US)

(72) Inventors: Brian Nault, Lockport, IL (US); Blair Kerr, Downers Grove, IL (US); Stefan Micic, North Miami, FL (US); Foster Pyle, Oswego, IL (US)

(73) Assignee: G&W Electric Company, Bolingbrook, IL (US)

( * ) Notice: Subject to any disclaimer, the term of this patent is extended or adjusted under 35 U.S.C. 154(b) by 143 days.

(21) Appl. No.: 18/422,816

(22) Filed: Jan. 25, 2024

(65) Prior Publication Data
US 2025/0244364 A1 Jul. 31, 2025

(51) Int. Cl.
*G01R 19/00* (2006.01)
*H01H 33/02* (2006.01)
*H01H 33/66* (2006.01)

(52) U.S. Cl.
CPC ....... *G01R 19/0084* (2013.01); *H01H 33/027* (2013.01); *H01H 33/6606* (2013.01)

(58) Field of Classification Search
CPC ............. G01R 19/0084; H01H 33/027; H01H 33/6606
See application file for complete search history.

(56) References Cited

U.S. PATENT DOCUMENTS

| | | | |
|---|---|---|---|
| 3,667,783 A | 6/1972 | Sotolongo | |
| 4,002,976 A | 1/1977 | Zulaski | |
| 4,241,373 A | 12/1980 | Mara et al. | |
| 6,041,679 A * | 3/2000 | Slater ................. | A61B 17/1608 164/517 |
| 6,362,444 B1 | 3/2002 | Lee | |
| 6,373,015 B1 | 4/2002 | Marchand et al. | |
| 6,538,422 B2 | 3/2003 | Potter et al. | |
| 7,285,743 B2 | 10/2007 | Martin | |
| 7,589,289 B2 | 9/2009 | Yu | |
| 8,674,254 B2 | 3/2014 | Borgstrom | |
| 9,040,861 B2 | 5/2015 | Park | |
| 9,318,887 B2 | 4/2016 | Fukuoka et al. | |
| 11,346,876 B2 | 5/2022 | Bauer | |
| 2001/0048308 A1 * | 12/2001 | Potter .................... | G01R 15/16 324/519 |
| 2002/0131223 A1 * | 9/2002 | Daharsh ............... | H01H 33/027 361/115 |

(Continued)

FOREIGN PATENT DOCUMENTS

| | | |
|---|---|---|
| EP | 3404688 A1 | 11/2018 |
| EP | 3961668 B1 | 6/2023 |

(Continued)

*Primary Examiner* — Akm Zakaria
(74) *Attorney, Agent, or Firm* — Michael Best & Friedrich LLP

(57) ABSTRACT
An electrical sensor includes a conductor and an electrical sensor surrounding the conductor to monitor the conductor. An insulating body is molded around the conductor and the electrical sensor. A conductive insert is coupled to the electrical sensor to support the screen around the conductor during molding of the insulating body. After molding, the conductive insert remains coupled to the electrical sensor as an electrical terminal.

19 Claims, 11 Drawing Sheets

(56)                    References Cited

U.S. PATENT DOCUMENTS

| | | | |
|---|---|---|---|
| 2009/0200270 A1 | 8/2009 | Chen et al. | |
| 2010/0283487 A1 | 11/2010 | Juds et al. | |
| 2012/0193325 A1 | 8/2012 | Borgstrom | |
| 2012/0261384 A1* | 10/2012 | LaBianco | ............ H01H 33/027 |
| | | | 200/48 R |
| 2022/0157544 A1 | 5/2022 | Ranedo Torres et al. | |
| 2022/0216022 A1 | 7/2022 | Shamseldin et al. | |

FOREIGN PATENT DOCUMENTS

| | | | |
|---|---|---|---|
| KR | 101497068 B1 | 3/2015 | |
| KR | 101501218 B1 | 3/2015 | |
| WO | 2012141860 A1 | 10/2012 | |

* cited by examiner

ELECTRICAL SENSOR AND METHOD OF MOLDING AN INSULATOR AROUND AN ELECTRICAL SENSOR

FIELD OF THE DISCLOSURE

The present disclosure relates to electrical sensors, including voltage measurement sensors for electrical equipment, such as switchgear.

BACKGROUND OF THE DISCLOSURE

Electrical sensors are used in electrical equipment such as switchgear to monitor voltage, current, and/or other electrical properties to which the electrical equipment is exposed. One such type of electrical sensor, (specifically, a voltage sensor), is a voltage measurement screen that surrounds an inner conductor and, together with the inner conductor, forms a capacitor. Such a voltage sensor is able to detect the voltage of the conductor without being in contact with the conductor and may be particularly suitable for use in high-voltage applications.

SUMMARY OF THE DISCLOSURE

In some aspects, the techniques described herein relate to an electrical sensor including: a conductor; a voltage measurement screen surrounding the conductor to monitor the conductor; an insulating body molded around the conductor and the voltage measurement screen; and a conductive insert coupled to the voltage measurement screen to support the voltage measurement screen around the conductor during molding of the insulating body, wherein after molding, the conductive insert remains coupled to the voltage measurement screen as an electrical terminal.

In some aspects, the techniques described herein relate to an electrical sensor including: a conductive member configured to monitor a conductor, the conductive member having an inside surface and an outside surface, the inside surface positioned to face toward the conductor, the conductive member configured to be encased in a molded insulating body; and a conductive insert coupled to the outside surface of the conductive member, the conductive insert configured to be gripped by a gripping tool to support the conductive member during molding of the insulating body, the conductive insert configured to remain coupled to the conductive member following completion of molding the insulating body.

In some aspects, the techniques described herein relate to a method of molding an insulating body over a voltage measurement screen positioned around a conductor, the method including: coupling a conductive insert to the voltage measurement screen prior to molding; gripping the conductive insert with a gripping tool to support the voltage measurement screen around the conductor; closing a mold around the voltage measurement screen and the conductor such that the gripping tool is positioned outside the mold; molding the insulating body around the voltage measurement screen and the conductor to insulate the voltage measurement screen and the conductor; opening the mold; and releasing the gripping tool from the conductive insert following molding such that the conductive insert remains coupled to the voltage measurement screen.

Other aspects of the disclosure will become apparent by consideration of the detailed description and accompanying drawings.

DETAILED DESCRIPTION

Before any embodiments of the disclosure are explained in detail, it is to be understood that the disclosure is not limited in its application to the details of construction and the arrangement of components set forth in the following description or illustrated in the following drawings. The disclosure is capable of supporting other embodiments and of being practiced or of being carried out in various ways. Also, it is to be understood that the phraseology and terminology used herein is for the purpose of description and should not be regarded as limiting. Also, as used herein and in the appended claims, the terms "upper," "lower," "top," "bottom," "front," "back," and other directional terms are not intended to require any particular orientation but are instead used for purposes of description only.

Figure 1:
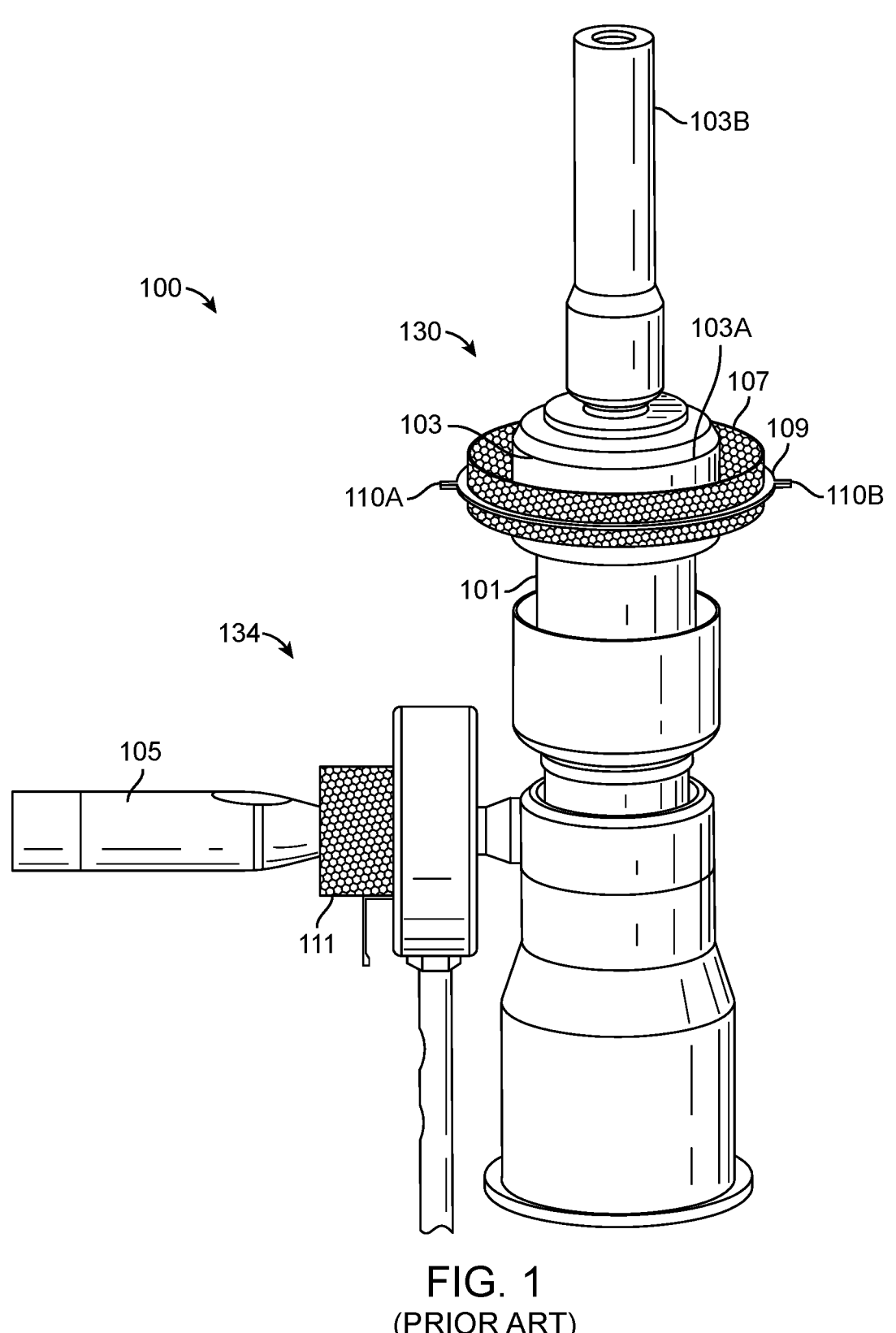
FIG. 1 illustrates a perspective view of an interrupter system according to the prior art.

FIG. 1 shows an interrupter system 100 according to one type of switchgear embodiment known in the prior art and in which a sensor assembly of the present disclosure can be used. A vacuum interrupter 101 is positioned between a top-side conductor 103 and a bottom-side conductor 105. The illustrated top-side conductor 103 includes a screen portion 103A that is electrically connected to a conductive rod 103B; however, the top-side conductor 103 may be configured differently in other embodiments. In this example, the top-side conductor 103 is a source side conductor while the bottom side conductor 105 is a load-side conductor. However, in other embodiments, this orientation may be reversed. A source-side sensor assembly 130, which may include a voltage detector and/or a current detector, is positioned proximate to the top-side conductor 103 to sense a voltage and/or current of the top-side conductor 103. The source-side sensor assembly 130 includes a first cylindrical voltage screen assembly 107 positioned around the top-side conductor 103 in a coaxial arrangement and spaced from the outer surface of the top-side conductor 103. A reinforcement ring 109 assists in positioning the first voltage screen assembly 107 when insulation 117 (FIG. 2) is molded over the vacuum interrupter 101, the conductors 103, 105, and the voltage screen assembly 107. The first voltage screen assembly 107 includes two tabs 110A, 110B that are positioned on opposite sides of the reinforcement ring 109. The tabs 110A, 110B extend radially away from the reinforcement ring 109 and the first voltage screen assembly 107. The tabs 110A, 110B are used for positioning the sensor assembly 130 during assembly of the sensor assembly 130 around the top-side conductor 103.

With continued reference to FIG. 1, during operation, the first voltage screen assembly 107 and the top-side conductor 103 form a capacitive coupling from which the voltage of the top-side conductor 103 can be determined. The calculation of the voltage of the top-side conductor 103 can be performed by a variety of systems such as a controller located proximate to the interrupter system, a remote computer system, or an application-specific integrated circuit ("ASIC").

With continued reference to FIG. 1, similar to the source-side sensor assembly 130, a load-side sensor assembly 134, which may include a voltage detector and/or a current detector, includes a second cylindrical voltage screen 111 positioned around the bottom-side conductor 105 to sense a voltage and/or current of the bottom-side conductor 105. A capacitive coupling between the second voltage screen 111 and the bottom-side conductor 105 can be used to determine a voltage of the bottom-side conductor 105. Because the sensor assemblies 130, 134 are arranged proximate to both the top-side conductor 103 and the bottom-side conductor 105, the interrupter system 100 can measure a voltage on either side of the interrupter 101 even when the interrupter 101 is positioned in an open position.

Figure 2:
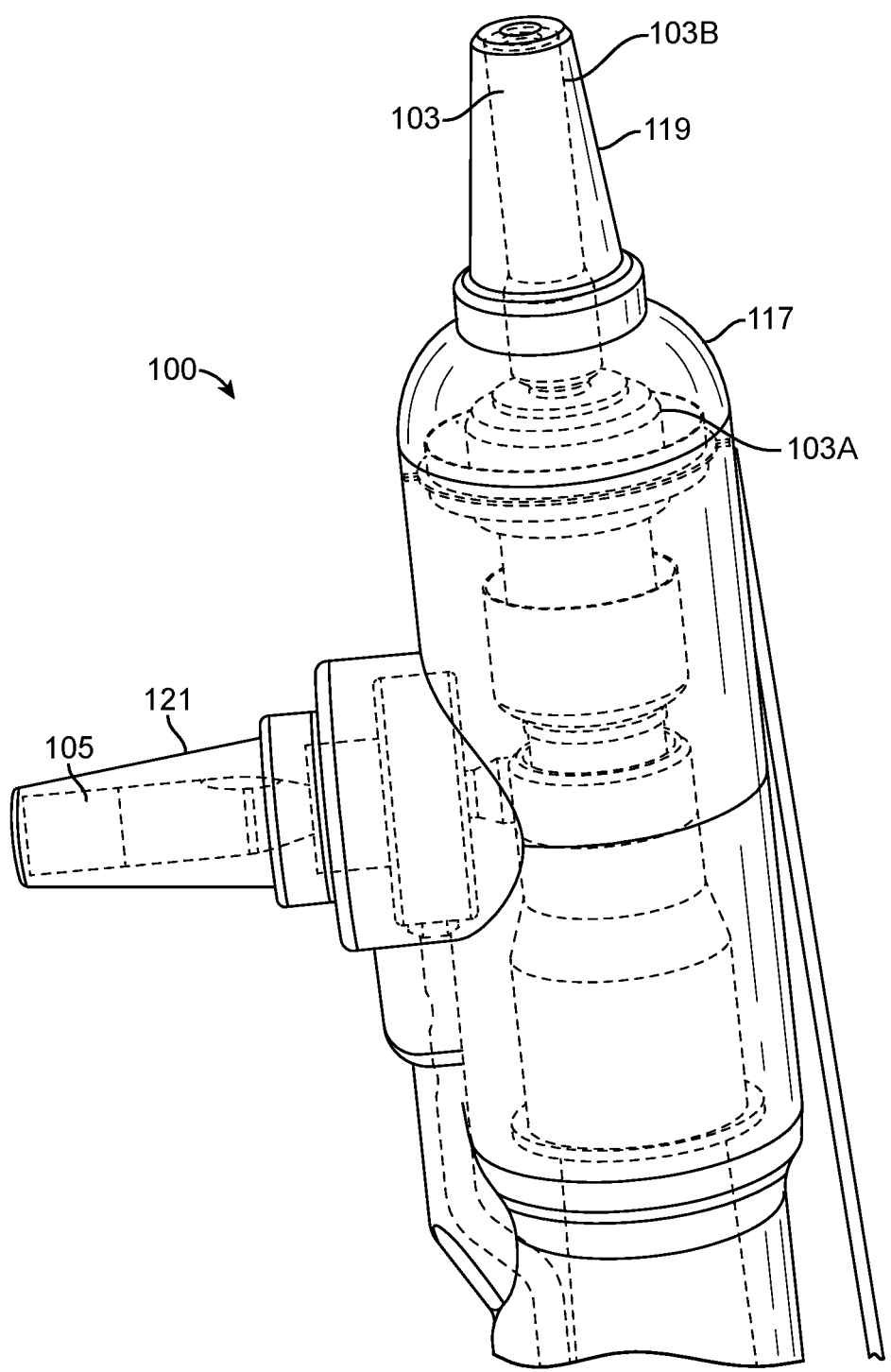
FIG. 2 illustrates a perspective view of the interrupter system of FIG. 1 encased within an overmold.

With reference to FIG. 2, the interrupter system 100 as illustrated in FIG. 1 is housed within the molded insulation 117 to form an encased system. The encased system also includes a top-side bushing 119 and a bottom-side bushing 121. In the illustrated embodiment, the bushings 119, 121 are molded as part of the same insulation 117 and are used to connect power cables to the top-side conductor 103 and the bottom-side conductor 105 of the interrupter system 100. In other embodiments, the bushings 119, 121 may be formed as separate pieces that are attached to the overmolded interrupter system 100. Further details relating to the interrupter system of FIGS. 1 and 2 can be found, for example, in U.S. Pub. No. 2012/0261384 A1, the entire contents of which are incorporated herein by reference. An example of another switchgear embodiment in which a voltage measurement device of the present disclosure can be used is found in U.S. Pub. No. 2022/0216022 A1, the entire contents of which are incorporated herein by reference.

Figure 3:
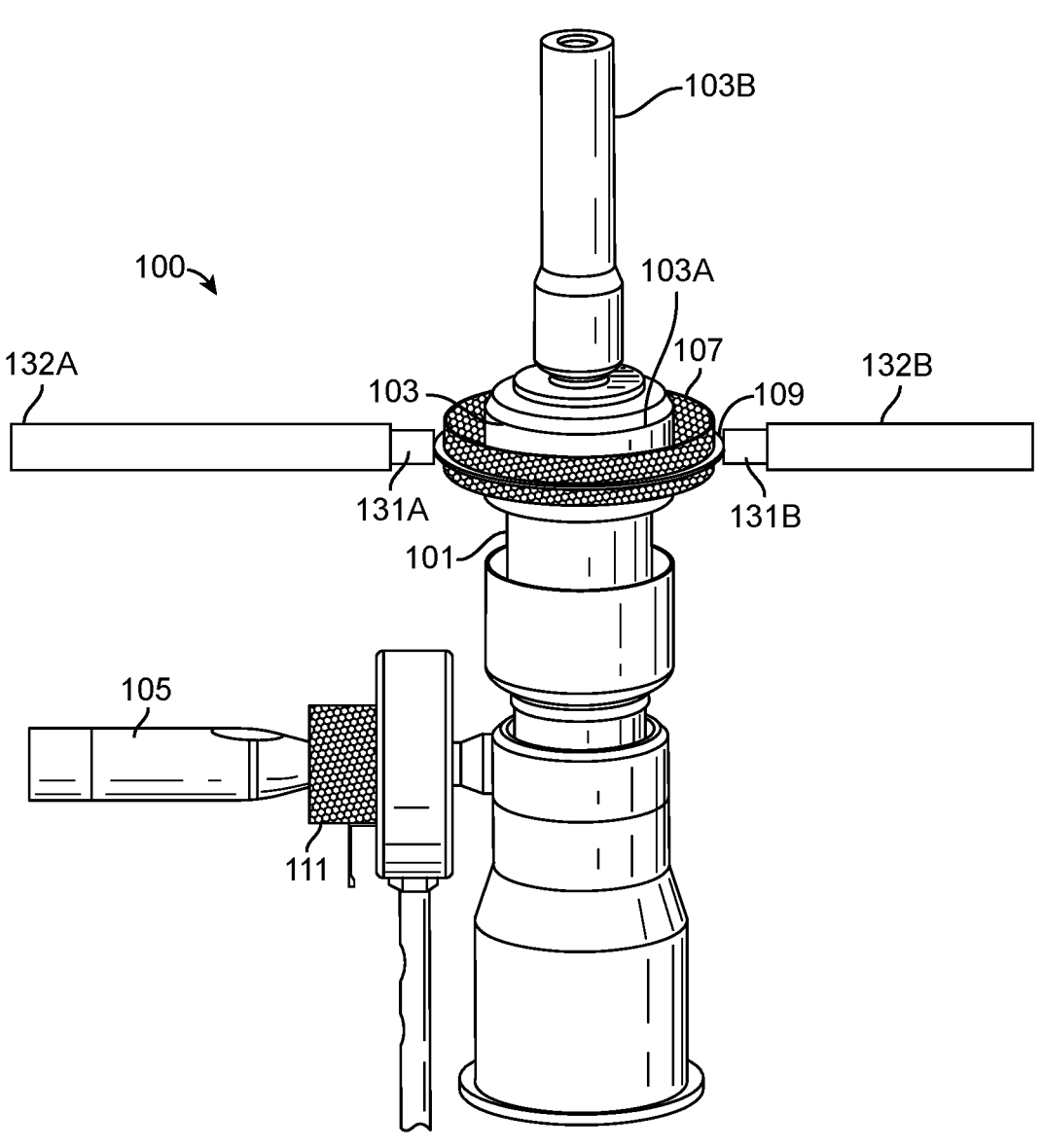
FIG. 3 illustrates a perspective view of the interrupter system of FIG. 1 showing gripping tools supporting a sensor assembly for a molding process.

With reference to FIG. 3, prior to molding the insulation 117 around the interrupter system 100, inserts 131A, 131B are mounted to the tabs 110A, 110B (FIG. 1) to provide attachment locations for gripping tools 132A, 132B, which will support the sensor assembly 130 during molding. A similar process may be used for supporting the sensor assembly 134. During molding of the insulation 117 around the interrupter system 100, the gripping tool 132A grips the insert 131A, and the gripping tool 132B grips the insert

131B. During molding, a mold is closed around the interrupter system 100, the insulation 117 is formed around the interrupter system 100, and the mold is removed from around the interrupter system 100 when the insulation sets. Following molding of the insulation 117, the gripping tools 132A, 132B and the inserts 131A, 131B are removed from engagement with the tabs 110A, 110B (FIG. 1). Because the inserts 131A, 131B are present during molding of the insulation 117 but are removed following molding of the insulation 117, two apertures remain in the insulation 117 following molding, each aperture corresponding to the prior location of one of the inserts 131A, 131B. One aperture may be filled (e.g., manually filled) with an insulating compound, and the other aperture may be used to access the sensor assembly 130 to attach a wire to the sensor assembly 130. Once connected to the sensor assembly 130, the wire transmits an electrical signal from the sensor assembly 130 to a controller.

Figure 4:
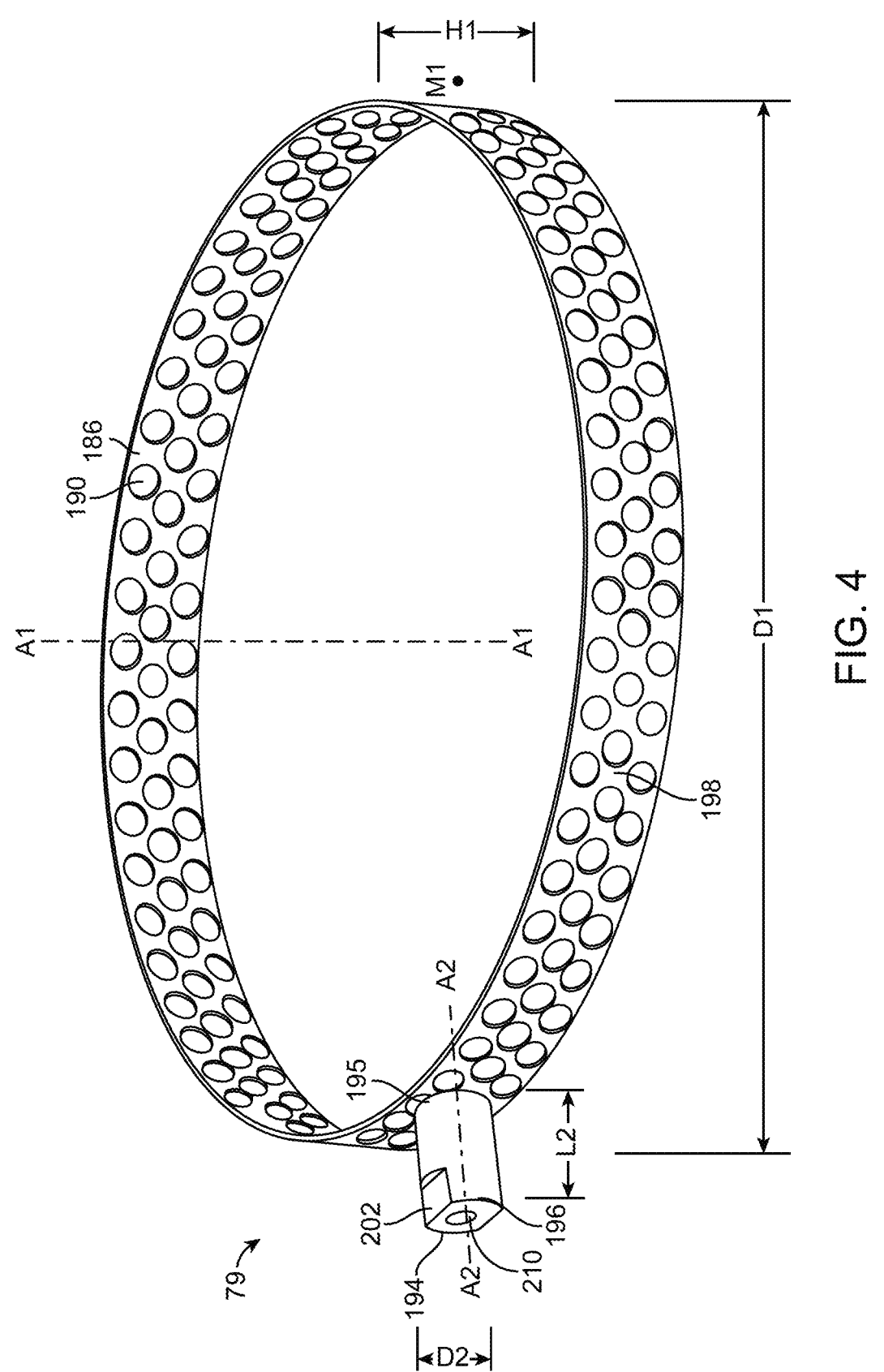
FIG. 4 illustrates a perspective view of a sensor assembly which may be used with an interrupter system such as that of FIG. 1 according to an embodiment of the present disclosure.

With reference to FIG. 4, an exemplary embodiment of a sensor assembly 79 may be a capacitive voltage detector assembly (i.e., a voltage measurement assembly), a current detector assembly (i.e., a current measurement assembly), or an assembly for detecting another property of a conductor or an electrical circuit of which the interrupter system 100 is a part. The sensor assembly 79 may be used with, for example, the interrupter system 100 in addition to or in place of the sensor assemblies 130, 134. The sensor assembly 79 includes a screen 186 which may also be referred to as a voltage measurement screen. In the illustrated embodiment, the screen 186 is cylindrical and is defined by an axial dimension such as a height H1 that is measured along an axis A1 of the screen 186 and a diametric dimension such as a diameter D1. The height H1 includes a midpoint M1 that is located at a halfway point of the height H1, and which defines a midpoint plane that is transverse to, and in the illustrated embodiment parallel to, the axis A1. The sensor assembly 79 may be coaxial with the inner conductor (e.g., the top-side conductor 103 or the bottom-side conductor 105). In other words, the axis A1 may be coaxial with an axis of, for example, an inner conductor such as the top-side conductor 103 or the bottom-side conductor 105.

With continued reference to FIG. 4, the diameter D1 is sized such that the screen 186 can be placed around a conductor such as the top-side conductor 103 or the bottom-side conductor 105. In the illustrated embodiment, the screen 186 is a perforated screen having a pattern of apertures 190 and constructed of a conductive material such as brass or aluminum. In other words, the screen 186 includes conductive mesh having an outside surface and an inside surface that is configured to face the conductor (e.g., the top-side conductor 103 or the bottom-side conductor 105). In other embodiments, the screen 186 may be constructed of a solid material without apertures.

With continued reference to FIG. 4, an insert 194 is affixed to and electrically coupled to the screen 186. In the illustrated embodiment, the sensor assembly 79 includes a single insert 194 coupled or affixed to the screen 186 at an outer surface 198 of the screen 186. The insert 194 includes a first end 195 proximal to the screen 186 and a second end 196 distal from the screen 186. In the illustrated embodiment, the insert 194 is generally cylindrically shaped and has an axial dimension such as a length L2 measured along an axis A2 and a diametric dimension such as a diameter D2. The axes A1, A2 may be transverse to each other and are, in the illustrated embodiment, perpendicular to each other. In the illustrated embodiment, the insert 194 is positioned on the screen 186 at the midpoint M1 of the height H1 such that the axis A2 is coplanar with the midpoint plane, which as disclosed herein includes the midpoint M1 and is perpendicular to the axis A1.

Figure 11:
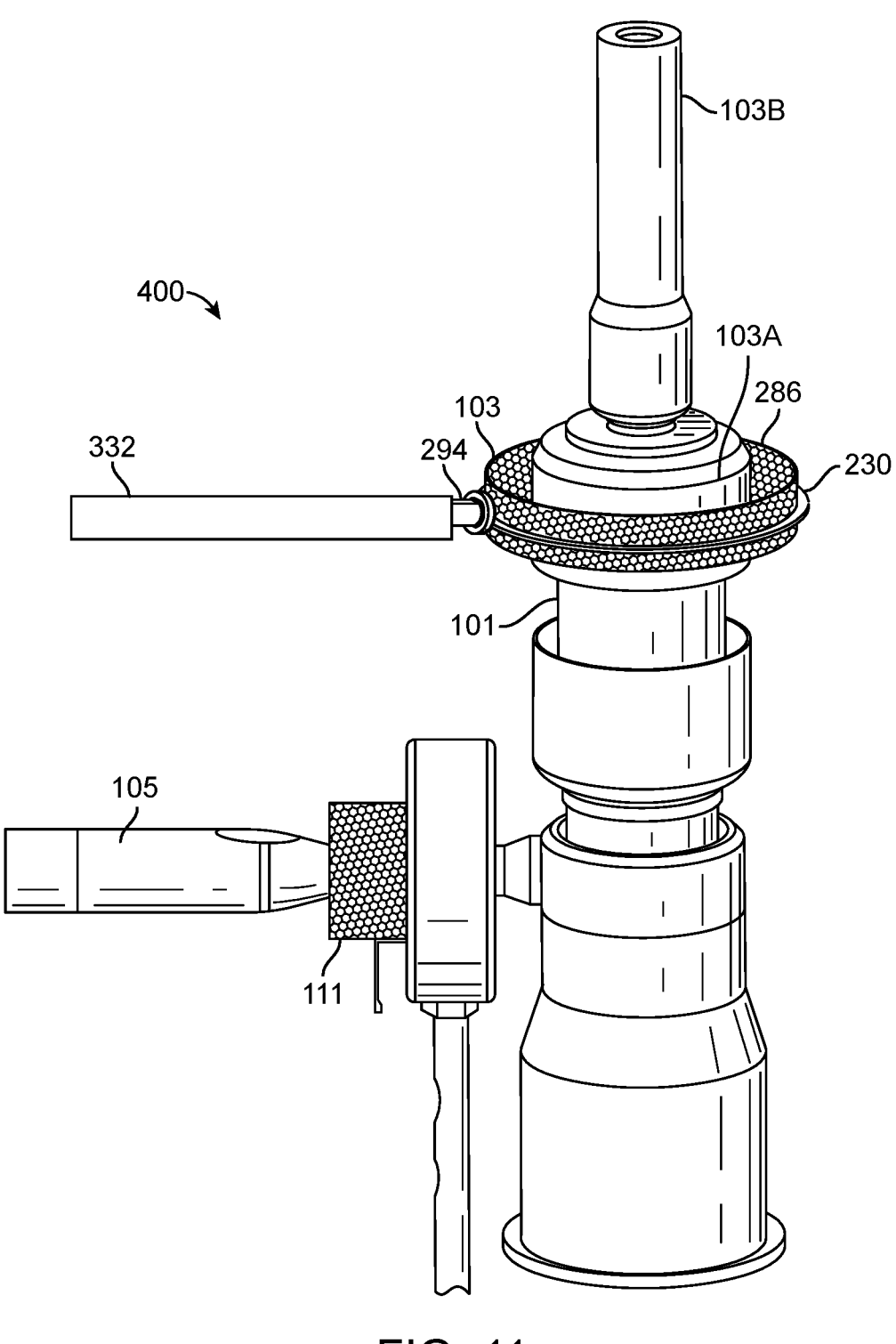
FIG. 11 illustrates a perspective view of an interrupter system including a sensor assembly supported by a gripping tool that is gripping a single insert of FIG. 10 for a molding process.

With continued reference to FIG. 4, the insert 194 includes a gripping interface to allow the insert 194 to be gripped by a gripping tool such as, for example, the gripping tool 332 of FIG. 11. The gripping interface may be constructed in a variety of different manners. In some embodiments, the gripping interface may include a single flat surface or a plurality of flat surfaces such that the gripping interface is shaped, for example, as a rectangle, hexagon, octagon, decagon, or dodecagon, etc. In some embodiments, the gripping interface may include one or more curved surfaces for gripping by a gripping tool (e.g., the gripping tool 332 of FIG. 11). In the illustrated embodiment, the insert includes two opposite flat surfaces or lands 202 provided at the second distal end 196 of the insert 194 and configured for being gripped by a gripping tool. A gripping tool is thus able to support the insert 194 and the screen 186 as a cantilever prior to and during a molding process.

With continued reference to FIG. 4, the insert 194 may be coupled to the screen 186 by fastening, welding, brazing, soldering, or another appropriate method. The illustrated insert 194 is made of a conductive material such as brass or aluminum. In some embodiments, the insert 194 may be integrally formed with the screen 186. The insert 194 is configured to attach to a wire 206 (FIGS. 5 and 6) to electrically couple the wire 206 to a controller or other electrical component external to the molded insulating body of the switchgear. In the illustrated embodiment, the insert 194 includes a bore 210 formed in the second end 196 of the insert 194 for affixing the wire 206 to the insert 194. The bore 210 in the illustrated embodiment is parallel to, and more specifically coaxial with, the axis A2, which is defined by the insert 194. The bore 210 may be internally threaded and configured to receive a screw 214 (FIG. 5) or a threaded ferrule 218 (FIG. 6) to connect the wire 206 to the insert 194.

Figure 5:
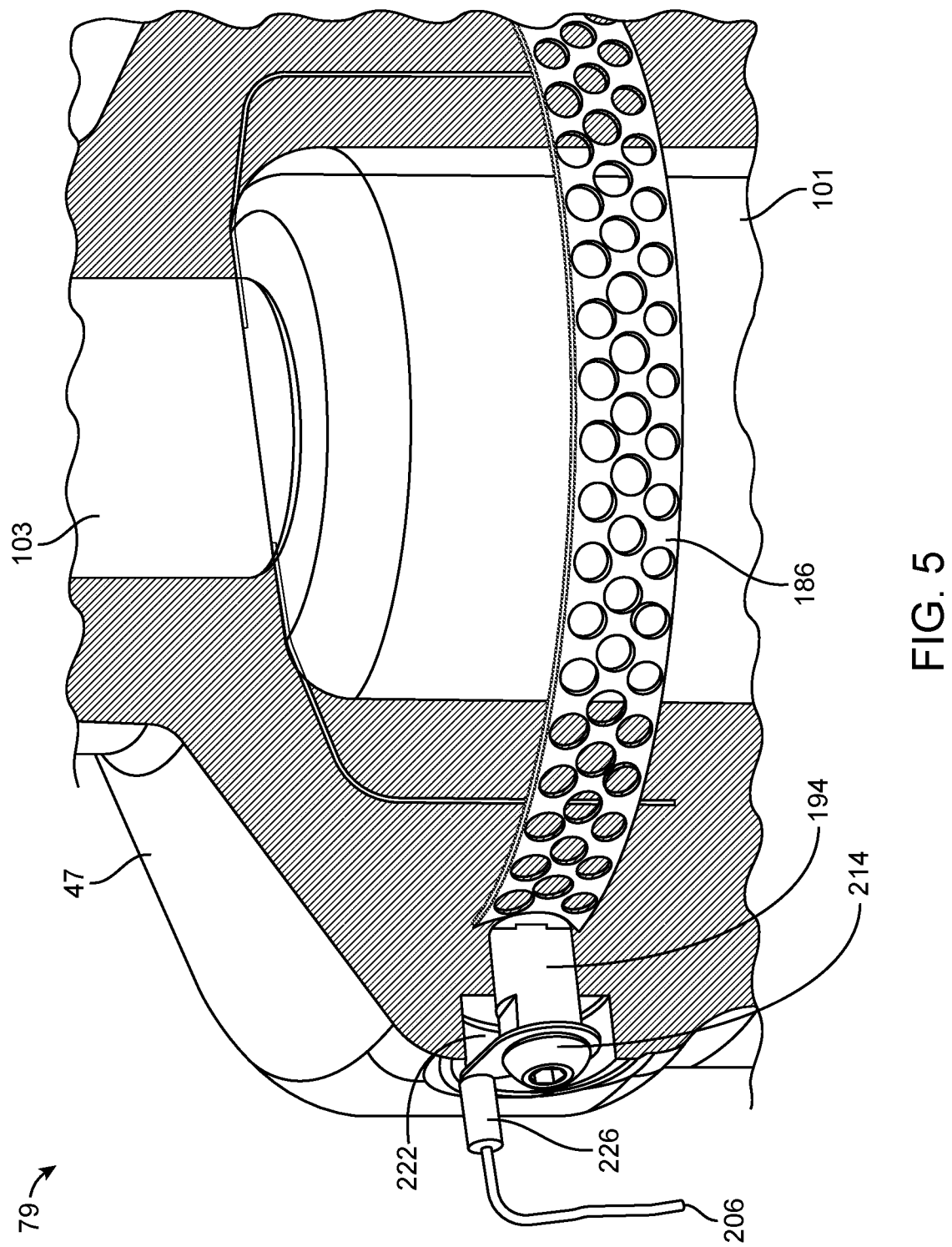
FIG. 5 illustrates a partial cutaway view of the sensor assembly of FIG. 4 and a wire coupled by a ring terminal and a screw to the sensor assembly, the sensor assembly surrounding an interrupter system and encased within an overmold.

With reference to FIG. 5, the sensor assembly 79 is encased in (i.e., molded within) an insulating body 47 such as, in the illustrated embodiment, the solid dielectric module 47. As is further discussed herein, the sensor assembly 79 is supported as a cantilever during molding by a gripping tool (e.g., the gripping tool 332 of FIG. 11) that holds the insert 194. When molding is complete, the gripping tool releases the insert 194 and is removed from the sensor assembly 79 while the insert 194 remains attached to the screen 186. An aperture or cavity 222 that was previously occupied by the gripping tool remains as a space in the molded insulating body 47 following molding However, because the insert 194 remains attached to the screen 186 following molding, rather than being removed from engagement with screen 186 as in the prior art process of FIGS. 1-3, there is no hole left that extends from the exterior of the insulating body to the screen 186, which would need to be separately filled with an insulating compound.

With continued reference to FIG. 5, the bore 210 in the insert 194 may be configured to receive a screw 214 to fasten a ring terminal 226 to the insert 194. The ring terminal 226 is configured to be electrically connected to the wire 206 such that the wire 206 is electrically connected to the screen 186 via the insert 194. As such, the insert 194 remains attached to the screen 186 following molding of the insulating body 47 and serves as a terminal for the screen 186 and, more generally, for the sensor assembly 79.

Figure 6:
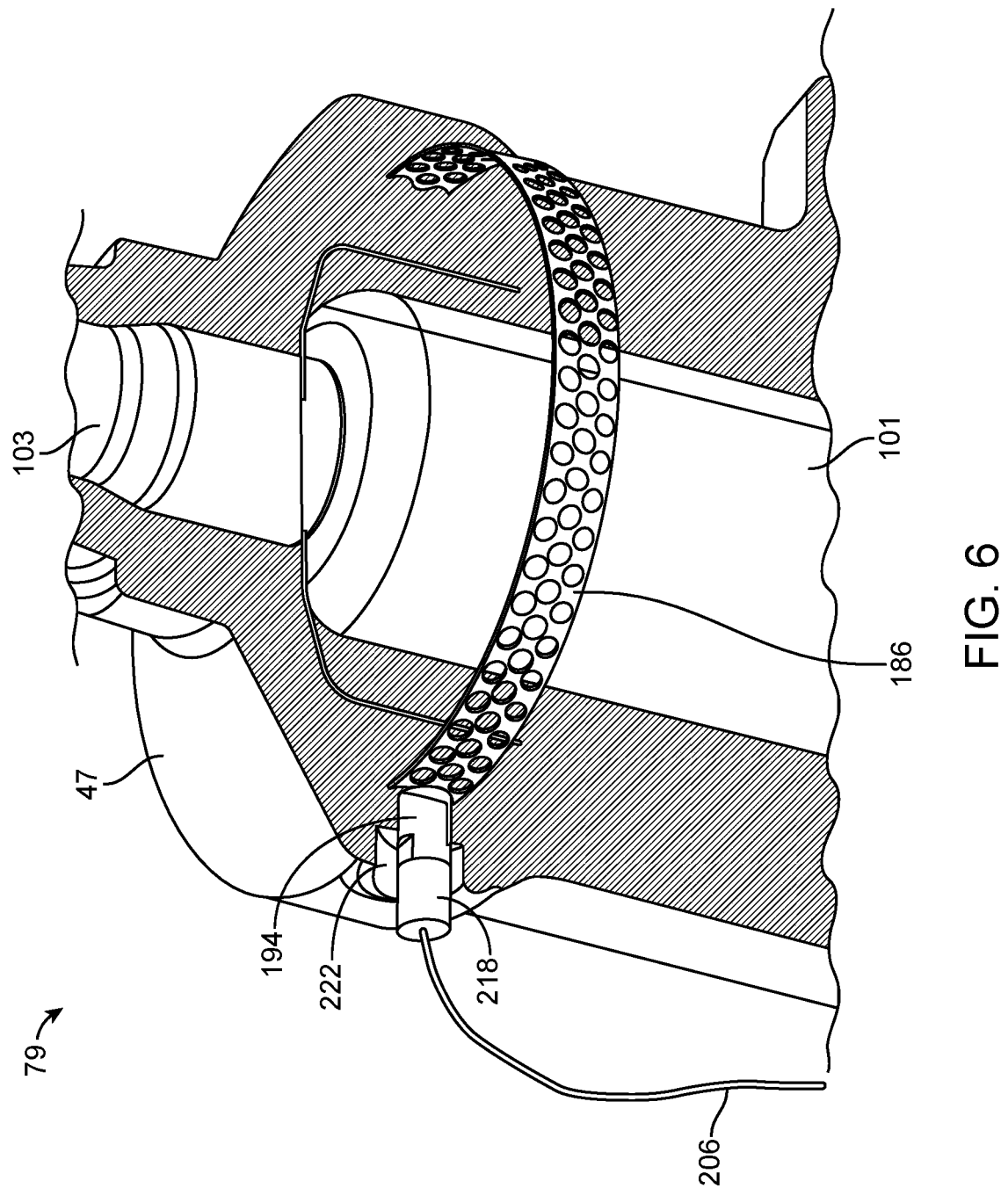
FIG. 6 illustrates a partial cutaway view of the sensor assembly of FIG. 4 and a wire coupled by a threaded ferrule to the sensor assembly, the sensor assembly surrounding an interrupter system and encased within an overmold.

With reference to FIG. 6, the insert 194 may be configured to receive the threaded ferrule 218 in the bore 210 to fasten the threaded ferrule 218 to the insert 194. The threaded ferrule 218 can be electrically connected to the wire 206 such that the wire 206 is electrically connected to the screen 186 via the insert 194. As such, the insert 194 serves as a terminal for the screen 186 and, more generally, for the sensor assembly 79.

In operation, and with reference to FIGS. 5 and 6, when a voltage is applied to an inner conductor (e.g., the top-side conductor 103 or the bottom-side conductor 105), the screen 186 and the inner conductor together form a capacitor from which the voltage of the inner conductor may be determined (e.g., via a capacitive divider circuit or the like). A calculation of the voltage of the inner conductor may be performed by a variety of systems such as by a controller located proximate to the interrupter system, a remote computer system, or an application-specific integrated circuit ("ASIC"). In some embodiments, the sensor assembly 79 may surround the vacuum interrupter 101. The screen 186 may be made of brass or aluminum or another conductive material or a semiconductive material.

Figure 7:
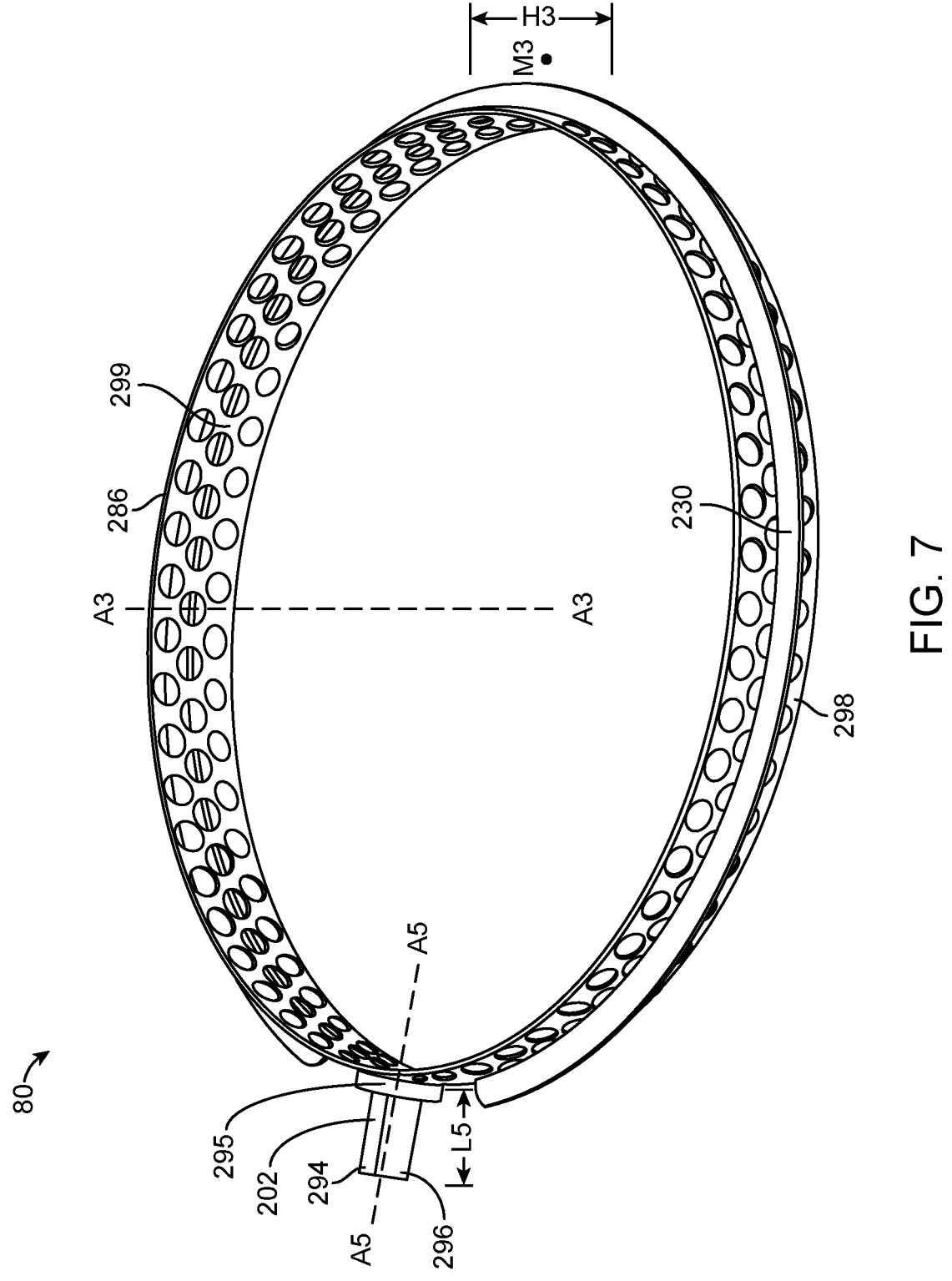
FIG. 7 illustrates a perspective view of a sensor assembly which may be used with an interrupter system such as that of FIG. 1 according to another embodiment of the present disclosure.
Figure 8:
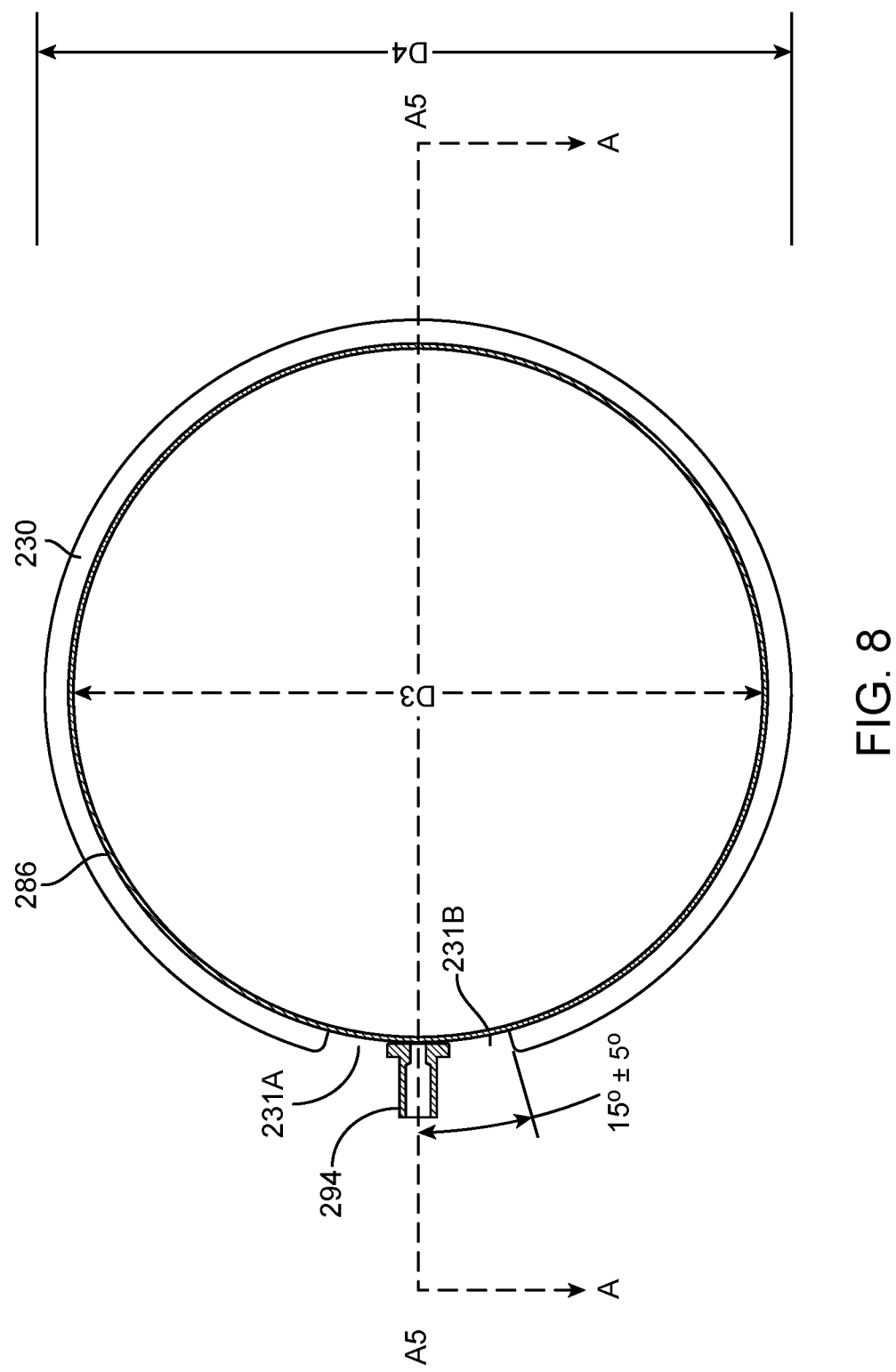
FIG. 8 illustrates a top view of the sensor assembly of FIG. 7.

With reference to FIG. 7, another embodiment of a sensor assembly 80, which may be generally similar in construction and function to the sensor assembly 79, includes a reinforcement ring 230 to support a screen 286. Similar to the sensor assembly 79, the screen 286 of the sensor assembly 80 may be cylindrical and is defined by an axial dimension such as a height H3 that is measured along an axis A3 of the screen 286 and a diametric dimension such as a diameter D3 (FIG. 8). The height H3 includes a midpoint M3 that is located at a halfway point of the height H3. The midpoint M3 defines a midpoint plane that is transverse to, and in the illustrated embodiment parallel to, the axis A3. In the illustrated embodiment, the reinforcement ring 230 is positioned around an outer surface 298 of the screen 286 and at least partially encircles the screen 286. In other embodiments, the reinforcement ring may be positioned around an inner surface 299 of the screen 286. The reinforcement ring 230 increases the rigidity of the screen 286, making the screen 286 more dimensionally stable, particularly when molding insulation around the sensor assembly 80.

In some embodiments, the reinforcement ring 230 is press-fit around the screen 286. The reinforcement ring 230 may instead, or additionally, be welded to the screen 286 (e.g., at multiple spots, such as four spots, or with a continuous weld bead). In some embodiments, the reinforcement ring 230 may be integrally formed with the screen 286. In the illustrated embodiment, the reinforcement ring 230 is positioned at the midpoint plane, but in other embodiments, the reinforcement ring 230 may be positioned at other locations such as, for example, above or below the midpoint plane.

With continued reference to FIG. 7, an insert 294, which may be generally similar in construction and function to the insert 194, is coupled to or affixed to the outer surface 298 of the screen 286. The insert 294 includes a first end 295 proximal to the screen 286 and a second end 296 distal from the screen 286. In the illustrated embodiment, the insert 294 is mushroom-shaped and has an axial dimension such as a length L5 measured along a central axis A5 and an outer diameter D4 perpendicular to the axis A5. In the illustrated embodiment, the reinforcement ring 230 extends approximately 330 degrees, plus or minus approximately 10 degrees, about the screen 286. More specifically, the reinforcement ring 230 extends completely around the screen 286, except that the reinforcement ring stops about 15 degrees, plus or minus 5 degrees, on either side of the axis A5 of the insert 294, leaving open spaces 231A, 231B on either side of the insert 294 in a circumferential direction about the screen 286 (FIG. 8).

Figure 9:
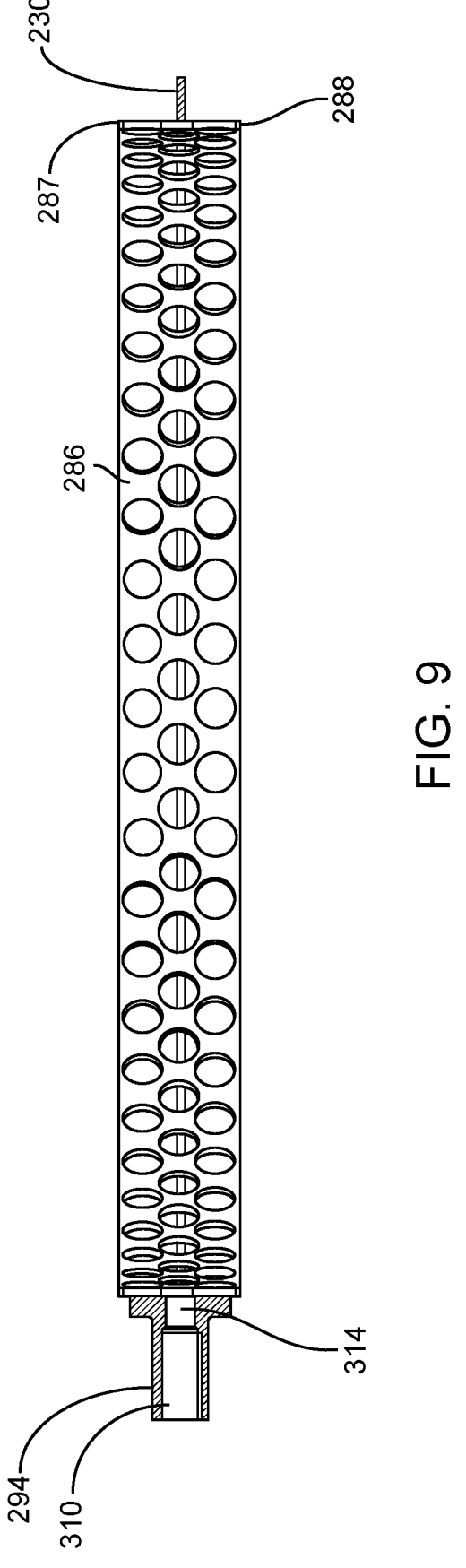
FIG. 9 illustrates a cross-section view of the sensor assembly of FIG. 7 along the line A-A of FIG. 8.

With reference to FIG. 9, the insert 294 includes a bore 310, which may be a threaded bore, which is configured to attach a wire to the insert 294. A fastener 314 couples the insert 294 to the screen 286 in the illustrated embodiment, but the insert 294 may be coupled to the screen 286 in other ways. The screen 286 defines a first edge 287 extending around a circumference of the screen 286 and an opposite, second edge 288 also extending around a circumference of the screen 286. In some embodiments, the first and second edges 287, 288 may be smoothed by grinding, melting, or any other suitable process.

Figure 10:
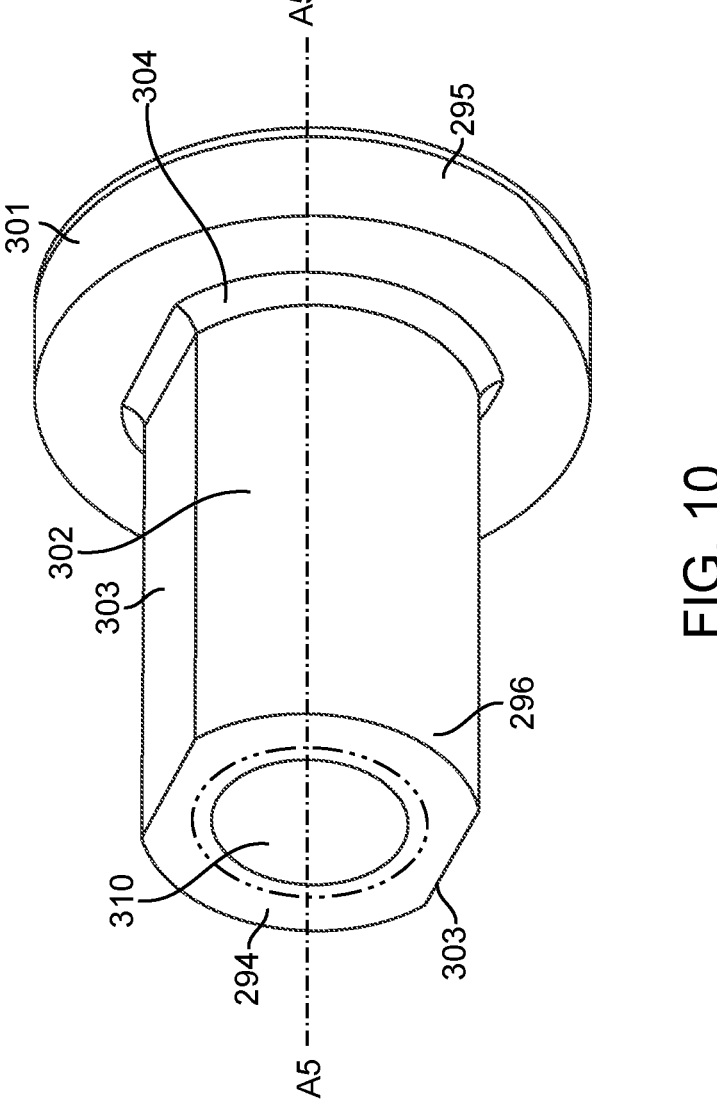
FIG. 10 illustrates a perspective view of an insert for use with the sensor assembly of FIG. 7.

With reference to FIG. 10, an embodiment of the insert 294 includes a first portion 301 configured to be attached to the screen 286 and a second portion 302 that is, in the illustrated embodiment, integrally formed with the first portion 301 and configured to extend away from the screen 286 when the insert 294 is attached to the screen 286. A chamfer 304 joins the first portion 301 and the second portion 302. The second portion 302 includes a gripping interface which, in the illustrated embodiment, includes a pair of opposed lands 303 that extends from near the first portion 301 along the second portion 302 to the distal end 296 of the insert 294.

With reference to FIG. 11, an interrupter system 400, which is similar to the interrupter system 100 but which includes the sensor assembly 80, includes an insert 294 that is gripped by a gripping tool 332 to support the sensor assembly 80 prior to and during the molding of an insulating body 47 (e.g., the insulating body 47 shown in FIGS. 5 and 6). FIG. 11 is also applicable to illustrate, by analogy, how a gripping tool 332 may grip the insert 194 to support the sensor assembly 79 prior to and during the molding of an insulating body 47. As is further discussed herein, the sensor assembly 80 is supported as a cantilever during molding by the gripping tool 332 that holds the insert 294. When molding is complete, the gripping tool 332 releases the insert 294, and the gripping tool 332 is removed from the sensor assembly 80 while the insert 294 remains attached to the screen 286. An aperture or cavity (e.g., the cavity 222 of FIGS. 5 and 6) that was previously occupied by the gripping tool 332 thus may remain in the molded insulating body 47 following molding. In other words, the cavity 222 may be the space that was occupied by the gripping tool during molding. However, because the insert 294 remains attached to the screen 286 following molding rather than being removed from engagement with one of the tabs 110A, 110B (as in the prior process of FIGS. 1-3), an aperture is not necessarily formed through the entirety of the insulating body that needs to be separately filled with an insulating compound.

With continued reference to FIG. 11, a method of molding an insulating body (e.g., the solid dielectric module 47) around the voltage measurement screen disclosed herein (e.g., the screen 186, 286) and a conductor (e.g., the top-side conductor 103 or the bottom-side conductor 105) includes attaching the insert 194, 294 to the screen 186, 286, gripping the insert 194, 294 with a gripping tool 332 to support the screen 186, 286 around the conductor, using the gripping tool 332 to position the screen 186, 286 within a mold and around the conductor, closing the mold around the screen 186, 286 and the conductor such that the gripping tool 332 is positioned outside of the mold, molding the insulating body 47 around the screen 186, 286 and the conductor, releasing the insert 194, 294 from the gripping tool 332, and opening the mold to remove the molded insulating body 47.

With continued reference to FIG. 11, the method may further comprise electrically connecting the wire 206 to the insert 194, 294 such that the insert 194, 294 functions as a terminal for the screen 186, 286. In some embodiments, the method step of electrically connecting the wire 206 to the insert 194, 294 may comprise threading the screw 214 into the threaded bore 210 of the insert 194 and attaching the wire 206 to the screw 214. In other embodiments, the method step of electrically connecting the wire 206 to the insert 194 may comprise threading a ferrule 218 into the bore 210, 310 of the insert 194, 294 and attaching the wire 206 to the ferrule 218. The method may further comprise transmitting an electrical signal through the insert 194, 294, through the aperture or cavity 222 in an exterior of the insulating body, and to a controller. In some embodiments, the method may further comprise placing the screen 186, 286 over the conductor before the insert 194, 294 is attached to the screen 186, 286, and in other embodiments, the method may further comprise attaching the insert 194, 294 to the screen 186, 286 before the screen 186, 286 is placed over the conductor.

Thus, the present disclosure provides, among other things, an electrical sensor in the form of a measurement screen that is supported as a cantilever at a single location prior to and/or during a process of molding an insulator around the measurement screen. This is an improvement with respect to measurement screens that require support at two or more locations. Further, the present disclosure provides a measurement screen with a support location that also functions as an electrical terminal for the measurement screen, which is an improvement with respect to measurement screens that require a separate component or assembly to function as an electrical terminal. Further, the present disclosure provides a measurement screen with a support location that remains attached to the measurement screen following molding, which is an improvement with respect to measurement screens having one or more support locations that must be removed from the measurement screens following molding and that leave a hole in the insulator following molding.

Various features and advantages of the invention are set forth in the following claims.

What is claimed is:

1. An electrical sensor comprising:
a conductor;
a voltage measurement screen surrounding the conductor to monitor the conductor;
an insulating body molded around the conductor and the voltage measurement screen; and
a conductive insert coupled to the voltage measurement screen to support the voltage measurement screen around the conductor as a cantilever during molding of the insulating body, wherein after the molding, the conductive insert remains coupled to the voltage measurement screen and extends through the insulating body to define an electrical terminal accessible from an exterior of the insulating body.

2. The electrical sensor of claim 1, wherein the conductive insert is welded to the voltage measurement screen.

3. The electrical sensor of claim 1, wherein the conductive insert supports the voltage measurement screen in a fixed position surrounding the conductor during molding of the insulating body, wherein the conductive insert remains fixed in place in the insulating body after the molding, and wherein the conductive insert extends through the insulating body such that the conductive insert is accessible from an exterior of the insulating body.

4. The electrical sensor of claim 1, wherein the conductive insert is configured to attach to a wire to electrically couple the wire to the voltage measurement screen.

5. A switchgear apparatus including a vacuum interrupter and the electrical sensor of claim 1, wherein a voltage of the conductor corresponds with a voltage of a terminal of the vacuum interrupter.

6. The electrical sensor of claim 1, wherein the conductive insert is the only insert coupled to the voltage measurement screen.

7. The electrical sensor of claim 1, wherein the voltage measurement screen is shaped as a cylinder having an axial dimension and a diametric dimension, the axial dimension having a midpoint, wherein the conductive insert is positioned on an outside surface of the voltage measurement screen at the midpoint of the axial dimension.

8. An electrical sensor comprising:

a conductive member configured to monitor a conductor, the conductive member having an inside surface and an outside surface, the inside surface positioned to face toward the conductor, the conductive member configured to be encased in a molded insulating body; and a conductive insert coupled to the outside surface of the conductive member, the conductive insert configured to be gripped by a gripping tool to support the conductive member as a cantilever during molding of the insulating body, wherein the conductive insert remains coupled to the conductive member following completion of the molding of the insulating body and extends through the insulating body to define an electrical terminal accessible from an exterior of the insulating body.

9. The electrical sensor of claim 8, wherein the conductive insert is the only insert coupled to the conductive member, and wherein the conductive insert includes two opposed lands configured to be gripped by the gripping tool during the molding.

10. The electrical sensor of claim 8, wherein the conductive insert is configured to electrically couple a wire to the conductive member.

11. The electrical sensor of claim 10, wherein the conductive insert includes an internally threaded bore to receive the wire.

12. The electrical sensor of claim 8, wherein a reinforcement ring surrounds the outside surface of the conductive member.

13. A method of molding an insulating body over an electrical sensor positioned around a conductor, the method comprising:

coupling a conductive insert to the electrical sensor prior to molding;

gripping the conductive insert with a gripping tool to support the electrical sensor around the conductor as a cantilever;

closing a mold around the electrical sensor and the conductor such that the gripping tool is positioned outside the mold;

molding the insulating body around the electrical sensor and the conductor to insulate the electrical sensor and the conductor;

opening the mold; and releasing the gripping tool from the conductive insert following the molding such that the conductive insert remains coupled to the electrical sensor and extends through the insulating body such that the conductive insert is accessible from an exterior of the insulating body.

14. The method of claim 13, further comprising electrically connecting a wire to the conductive insert such that the conductive insert functions as a terminal for the electrical sensor.

15. The method of claim 14, further comprising threading a screw into a threaded bore in the conductive insert to electrically connect the wire to the conductive insert.

16. The method of claim 14, further comprising threading a threaded ferrule into a threaded bore in the conductive insert to electrically connect the wire to the conductive insert.

17. The method of claim 13, further comprising transmitting an electrical signal through the conductive insert, through an aperture in an exterior of the insulating body, and to a controller.

18. The method of claim 13, further comprising placing the electrical sensor over the conductor before the conductive insert is coupled to the electrical sensor.

19. The method of claim 13, further comprising coupling the conductive insert to the electrical sensor before the electrical sensor is placed around the conductor.

* * * * *